United States Patent
Jimbo

(10) Patent No.: US 7,118,638 B2
(45) Date of Patent: Oct. 10, 2006

(54) NONWOVEN FABRIC, HYGROSCOPIC MEMBER, METHOD AND APPARATUS FOR PRODUCING NONWOVEN FABRIC AND ORGANIC ELECTROLUMINESCENCE DISPLAY

(75) Inventor: Masato Jimbo, Yokohama (JP)

(73) Assignees: Yamaichi Electronics Co., Ltd., Tokyo (JP); Matty Co., Ltd., Okayama (JP)

( * ) Notice: Subject to any disclaimer, the term of this patent is extended or adjusted under 35 U.S.C. 154(b) by 0 days.

(21) Appl. No.: 10/648,269

(22) Filed: Aug. 27, 2003

(65) Prior Publication Data

US 2004/0048533 A1  Mar. 11, 2004

(30) Foreign Application Priority Data

Aug. 28, 2002  (JP) ........................... 2002-249681
Jul. 14, 2003  (JP) ........................... 2003-274225

(51) Int. Cl.
*D04H 1/72* (2006.01)
*D04H 13/00* (2006.01)

(52) U.S. Cl. .................. 156/62.4; 156/167; 156/181; 156/269; 264/8

(58) Field of Classification Search ........... 156/62.4, 156/167, 180, 181, 250, 269; 264/8
See application file for complete search history.

(56) References Cited

U.S. PATENT DOCUMENTS

| | | | | |
|---|---|---|---|---|
| 4,604,313 A | * | 8/1986 | McFarland et al. | 428/172 |
| 4,610,678 A | * | 9/1986 | Weisman et al. | 604/368 |
| 5,232,638 A | * | 8/1993 | Thiessen et al. | 264/6 |
| 5,326,241 A | * | 7/1994 | Rook et al. | 425/7 |
| 5,595,584 A | * | 1/1997 | Loftus et al. | 65/442 |
| 5,674,339 A | * | 10/1997 | Groeger et al. | 156/145 |
| 5,736,475 A | * | 4/1998 | Bakhshi et al. | 442/415 |
| 5,759,680 A | * | 6/1998 | Brooks et al. | 428/326 |
| 5,900,206 A | * | 5/1999 | Pellegrin et al. | 264/555 |
| 6,344,077 B1 | * | 2/2002 | Hong | 106/162.2 |
| 2002/0087129 A1 | * | 7/2002 | Di Luccio et al. | 604/304 |

FOREIGN PATENT DOCUMENTS

| | | | |
|---|---|---|---|
| EP | 388120 A1 | * | 9/1990 |
| FR | 2764185 A1 | * | 12/1998 |
| JP | 48-35184 | | 5/1973 |
| JP | 51-53013 | | 5/1976 |
| JP | 62-148557 | | 7/1987 |
| JP | 06-170149 | | 5/1994 |
| JP | 07-268767 | | 10/1995 |
| JP | 2000-195661 | | 7/2000 |
| JP | 2003-274225 | | 4/2004 |

OTHER PUBLICATIONS

English translation of Final Office Action, dated Sep. 13, 2005, issued by Japanese Patent Office in corresponding Japanese Patent Application No. 2003–274225.
Japan 07–2688767, Oct. 1995, Computer English translation.*

* cited by examiner

*Primary Examiner*—Sam Chuan Yao
(74) *Attorney, Agent, or Firm*—Finnegan Henderson Farabow Garrett & Dunner LLP

(57) ABSTRACT

An organic electroluminescence display includes a transparent glass substrate, an ITO anode layer, a positive hole transition layer, an RGB luminescence layer, an electron transition layer and a metallic cathode layer. Highly pressurized $N_2$ gas is sealed in the interior of the display. To absorb and retain the moisture in the sealed gas, a hygroscopic member is disposed between a sealing member and the cathode layer. The hygroscopic member includes a nonwoven fabric including a fiber layer made of fibers bonding to each other and a hygroscopic agent adhering to one surface of the fiber layer and an air-permeable sheet covering the nonwoven fabric as a whole.

6 Claims, 17 Drawing Sheets

NONWOVEN FABRIC, HYGROSCOPIC MEMBER, METHOD AND APPARATUS FOR PRODUCING NONWOVEN FABRIC AND ORGANIC ELECTROLUMINESCENCE DISPLAY

This application claims priority from Japanese Patent Application Nos. 2002-249681 filed Aug. 28, 2002 and 2003-274225 filed Jul. 14, 2003, which are incorporated hereinto by reference.

BACKGROUND OF THE INVENTION

1. Field of the Invention

The present invention relates to a nonwoven fabric, a hygroscopic member, a method and an apparatus for producing a nonwoven fabric and an organic electroluminescence display with a nonwoven fabric serving as a hygroscopic member for absorbing moisture.

2. Description of the Related Art

Now, an organic electroluminescence display used as a display of various electronic equipments has been promptly developed, and already put into practice in a certain field, such as a display for a cellular phone. Such a organic electroluminescence display of such a kind is formed by laminating a plurality of layers such as an electrode layer (anode and cathode), an electron transition layer, a positive hole transition layer and a luminescence layer on a substrate, each of these layers being made of polymeric or monomeric organic compounds. On the other hand, it has been known that the organic electroluminescence display is easily deteriorated by moisture. That is, in the organic electroluminescence display, the luminescence layer and the electrode layer are separated from each other by the existence of moisture or the molecular structure of the luminescence layer changes due to moisture to result in a display defect called a dark spot.

Accordingly, when the organic electroluminescence display is produced, it is usual that the organic compound layers are formed on the substrate while not being exposed to the atmosphere, and an assembly of the formed layers is sealed within a sealing member made of metal, resin or glass. As described in Japanese Patent Application Laid-open No. 2000-195661, a drying agent is disposed in the interior of the sealing member.

To provide the drying agent in the interior of the sealing member, however, it is necessary to attach the drying agent at a predetermined position in the interior of the sealing member after it has been put in a package or mixed with the organic compound. Accordingly, a process for producing the organic electroluminescence display becomes considerably complex accompanied with the provision of the drying agent. Also, when the drying agent is disposed within the sealing member, it may be necessary to form a mounting section for the drying agent in the sealing member, which disturbs the compactness (thinning) of the organic electroluminescence display. The present invention is directed to overcome one or more of the problems as set forth above.

SUMMARY OF THE INVENTION

The nonwoven fabric of the present invention is a nonwoven fabric comprising: fibers bonding to each other; and a hygroscopic agent adhering to part of the fibers.

The hygroscopic member of the present invention is a hygroscopic member comprising: a nonwoven fabric including a fiber layer made of fibers bonding to each other and a hygroscopic agent adhering to one surface of the fiber layer; and an air-permeable sheet covering the entirety of the nonwoven fabric.

The method for producing a nonwoven fabric of the present invention is a method for producing a nonwoven fabric by bonding fibers to each other, comprising the steps of: supplying raw material of the fibers to a first centrifugal separator; ejecting fibers from the first centrifugal separator by a centrifugal force; and supplying a hygroscopic agent onto the fibers ejected from the first centrifugal separator so that the hygroscopic agent adheres to at least part of the fibers.

Another method for producing a nonwoven fabric of the present invention is a method for producing a nonwoven fabric by bonding fibers to each other, comprising the steps of: (a) supplying raw material of fibers to a centrifugal separator; (b) ejecting fibers from the centrifugal separator by a centrifugal force and forming a fiber layer by bonding the ejected fibers; and (c) adhering a hygroscopic agent to the fiber layer.

The apparatus for producing a nonwoven fabric of the present invention is an apparatus for producing a nonwoven fabric by bonding fibers to each other, comprising: a raw material supplying means for supplying raw material of the fibers; a first centrifugal separator receiving the raw material from the raw material supplying means and ejecting the fibers by a centrifugal force; a hygroscopic agent supplying means provided in the first centrifugal separator for supplying a hygroscopic agent onto the ejected fibers; and a belt mechanism driven to circulate below the first centrifugal separator.

Another apparatus for producing a nonwoven fabric of the present invention is an apparatus for producing a nonwoven fabric by bonding fibers to each other, comprising: a raw material supplying means for supplying raw material of fibers; a centrifugal separator receiving the raw material from the raw material supplying means and ejecting the fibers by a centrifugal force; a belt mechanism driven to circulate below the first centrifugal separator; a heating means disposed downstream from the centrifugal separator for heating a fiber layer formed on the belt; and a hygroscopic agent supplying means disposed downstream from the heating means for supplying a hygroscopic agent onto the fiber layer heated by the heating means.

The organic electroluminescence display of the present invention is an organic electroluminescence display comprising: a substrate; a plurality of organic compound layers formed on the substrate; and a hygroscopic member for absorbing and retaining moisture, the hygroscopic member including a nonwoven fabric made of fibers bonding to each other and a hygroscopic agent adhering to part of the fibers.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1:
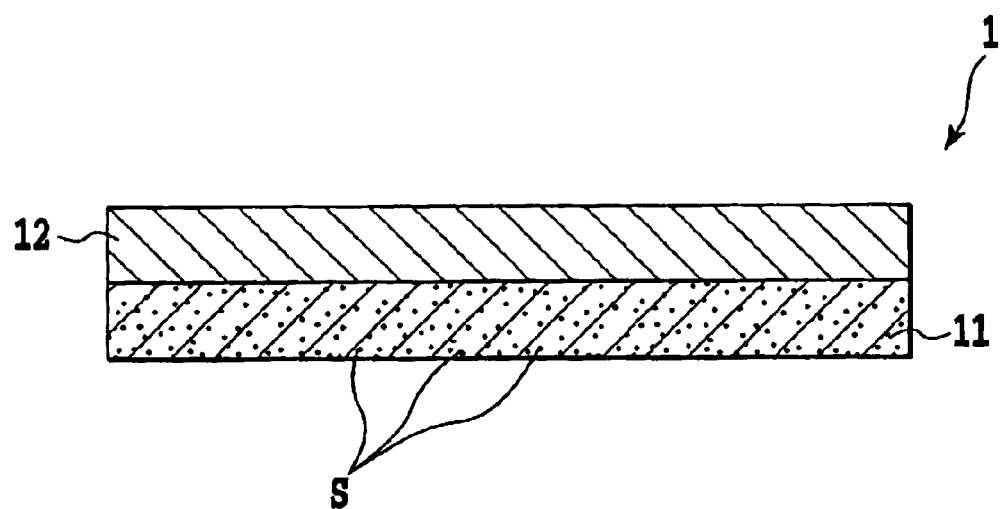
FIG. 1 is a sectional view of a nonwoven fabric according to a first embodiment of the present invention.

The nonwoven fabric according to an embodiment of the present invention serves as a hygroscopic member for absorbing and retaining moisture, since a hygroscopic agent is adhered to at least part of fibers. Also, since size, thickness or other aspects of the nonwoven fabric itself may be easily and freely selected, the nonwoven fabric can be used as a hygroscopic member that is excellent in general versatility, productivity and handleability.

The hygroscopic agent preferably includes a substance having a high hygroscopic capacity and porous particles of silicon dioxide adhered to the periphery of the above-mentioned substance.

Further, the nonwoven fabric preferably includes a first layer made of fibers to which the hygroscopic agent adheres and a second layer made of fibers to which no hygroscopic agent adheres. Thus, even if the hygroscopic agent is separated from the fibers of the first layer, the separated hygroscopic agent can be caught by the second layer. Accordingly, the hygroscopic capacity of the nonwoven fabric can be well maintained for a long period.

Also, the hygroscopic member of the present invention includes the above-mentioned nonwoven fabric having a fiber layer made of fibers bonding to each other and a hygroscopic agent adhered to one surface of the fiber layer, and an air-permeable sheet covering the entirety of the nonwoven fabric.

Such a hygroscopic member can be formed to be flexible and thin. Also, since the fiber layer to which the hygroscopic agent adheres is covered with the air-permeable sheet, even if the hygroscopic agent is separated from the fiber layer, the separated hygroscopic agent remains within the air-permeable sheet so that the hygroscopic capacity of the hygroscopic member is well maintained for a long period. Accordingly, such a hygroscopic member is very suitable for being used, for example, as a drying agent for the organic electroluminescence display, thereby preventing troubles of the display.

A method for producing the nonwoven fabric according to the present invention includes the steps of: supplying raw material of fibers to a first centrifugal separator; ejecting the fibers from the first centrifugal separator by a centrifugal force; and supplying a hygroscopic agent onto the fibers ejected from the first centrifugal separator so that the hygroscopic agent adheres to at least part of the fibers.

In this method, the raw material of the fibers such as a molten mixture of propylene and atactic polymer is supplied to the first centrifugal separator, and viscous fibers are ejected from the first centrifugal separator by the centrifugal force. Then, the hygroscopic agent is supplied onto the ejected fibers so that the hygroscopic agent adheres to at least part of the ejected fibers. Thus, it is possible to uniformly adhere the hygroscopic agent to the ejected fibers by properly adjusting a position at which the hygroscopic agent is supplied, an amount thereof or the like. According to this method, it is possible to easily and effectively produce the nonwoven fabric that is excellent in hygroscopic capacity.

Preferably, a second centrifugal separator is disposed on a lateral side of the first centrifugal separator, and a belt mechanism including a belt driven to circulate is disposed below the first and second centrifugal separators. The method for producing the nonwoven fabric preferably includes the steps of: forming, on the belt, a first layer of the fibers ejected from the first centrifugal separator, the hygroscopic agent adhering to at least part of said fibers; and ejecting fibers from the second centrifugal separator by a centrifugal force to form a second layer made only of the fibers on the first layer.

According to this method, it is possible to easily and effectively produce the nonwoven fabric excellent in handleability, including the first layer made of the fibers to which the hygroscopic agent adheres to have the hygroscopic capacity and the second layer having no hygroscopic capacity.

Another method for producing a nonwoven fabric according to the present invention comprises the steps of: (a) supplying raw material of fibers to a centrifugal separator; (b) ejecting fibers from the centrifugal separator by a centrifugal force and forming a fiber layer by bonding the ejected fibers; and (c) adhering a hygroscopic agent to the fiber layer.

According to this method, the raw material of fibers such as a molten mixture of propylene and atactic polymer is supplied to the centrifugal separator, and viscous fibers are ejected from the centrifugal separator by the centrifugal force. The fibers are then bonded together to form the fiber layer. Further, the hygroscopic agent is supplied onto the fiber layer. As a result, flexible and thin nonwoven fabric excellent in hygroscopic capacity can be easily and effectively produced.

Preferably, the step (c) includes the steps of heating the fiber layer and spraying the hygroscopic agent onto the heated fiber layer. Thus, it is possible to uniformly and firmly adhere the hygroscopic agent to the fiber layer.

The method preferably includes a step (d) for covering the entirety of the fiber layer to which the hygroscopic agent adheres with an air-permeable sheet.

Further, the step (d) preferably includes the steps of supplying the air-permeable sheet above and below the fiber layer to which the hygroscopic agent adheres, and cutting the fiber layer to which the hygroscopic agent adheres into a desired number of pieces having a desired size and simultaneously therewith, covering each of the pieces with the air-permeable sheet. Thus, it is possible to effectively produce the compact and excellent hygroscopic members capable of maintaining the hygroscopic capacity for a long period.

An apparatus for producing a nonwoven fabric according to the present invention includes a raw material supplying means for supplying raw material of fibers, a first centrifugal separator receiving the raw material from the raw material supplying means and ejecting the fibers by a centrifugal force, a hygroscopic agent supplying means in the first centrifugal separator for supplying a hygroscopic agent onto the ejected fibers, and a belt mechanism driven to circulate below the first centrifugal separator.

Preferably, the apparatus for producing a nonwoven fabric further includes a second centrifugal separator capable of ejecting fibers by a centrifugal force, disposed on the lateral side of the first centrifugal separator and above the belt mechanism.

Another apparatus for producing a nonwoven fabric according to the present invention includes a raw material supplying means for supplying raw material of fibers, a centrifugal separator receiving the raw material from the raw material supplying means and ejecting the fibers by a centrifugal force, a belt mechanism driven to circulate below the first centrifugal separator, a heating means disposed downstream from the centrifugal separator for heating a fiber layer formed on the belt, and a hygroscopic agent supplying means disposed downstream from the heating means for supplying a hygroscopic agent onto the fiber layer heated by the heating means.

Preferably, the apparatus for producing a nonwoven fabric further includes a sheet supplying means for supplying an air-permeable sheet above and below the fiber layer to which the hygroscopic agent adheres, and a thermo-compressive bonding and cutting means for cutting the fiber layer to which the hygroscopic agent adheres into a desired number of pieces having a desired size and simultaneously therewith, capable of covering each of the pieces with the air-permeable sheet.

An organic electroluminescence display according to the present invention includes a substrate, a plurality of organic compound layers formed on the substrate, and a hygroscopic member for absorbing and retaining moisture, the hygroscopic member including a nonwoven fabric made of fibers bonding to each other and a hygroscopic agent adhering to part of the fibers.

In the organic electroluminescence display, the nonwoven fabric includes a hygroscopic agent adhering to at least part of fibers and is used as a hygroscopic member for preventing the organic compound layers from being damaged due to moisture. By applying the nonwoven fabric serving itself as a hygroscopic member to the organic electroluminescence display, it is unnecessary to attach a drying agent to a predetermined position in a sealing member of the organic electroluminescence display after being put in a package or mixed with the organic compound as in the prior art. Also, the hygroscopic capacity of this nonwoven fabric can be easily and optionally determined by adjusting an amount of the hygroscopic agent adhering to the fibers as well as a size or a thickness thereof. Since it is unnecessary to form a mounting section for the hygroscopic agent in the sealing member of the organic electroluminescence display, the complexity of the process for producing the organic electroluminescence display can be reduced, which is accompanied with the disposition of the drying agent in the prior art, and also the organic electroluminescence display becomes compact as a whole. In the organic electroluminescence display, the deterioration thereof due to the moisture such as the generation of dark spots can be surely prevented.

Preferably, the nonwoven fabric serving as a hygroscopic member in the organic electroluminescence display includes a fiber layer made of fibers bonding to each other and a hygroscopic agent adhering onto the surface of the fiber layer. The entirety of the nonwoven fabric is covered with an air-permeable sheet. By adopting such a flexible and thin hygroscopic member excellent in hygroscopic capacity, the organic electroluminescence display can be compact (particularly thin) while surely preventing the generation of dark spots or the like.

The nonwoven fabric, hygroscopic member, method and apparatus for producing the nonwoven fabric and organic electroluminescence display according to the present invention will be described in detail with reference to the attached drawings.

(First Embodiment)

FIG. 1 is a sectional view of a nonwoven fabric 5 according to a first embodiment of the present invention. The nonwoven fabric 1 of FIG. 1 is capable of serving as a hygroscopic member. Since a size, a thickness or the like of the nonwoven fabric 1 can be easily and freely selected, the nonwoven fabric 1 can be used as a hygroscopic member having an extremely high general versatility, productivity and handleability. As shown in FIG. 1, the nonwoven fabric 1 of the present invention has a double-layered structure including a first layer 11 and a second layer 12. The first layer 11 is formed of a nonwoven fabric made of fibers to which fine particles of hygroscopic agent S adheres. The second layer 12 is laminated (bonded) to the first layer 11 and is formed of a nonwoven fabric made of fibers to which no hygroscopic agent S adheres. Even if hygroscopic agent S is separated from the fibers of the first layer 11, the separated hygroscopic agent S could be caught by the second layer 12 so that the hygroscopic capacity of the nonwoven fabric 1 is well maintained for a long period.

Figure 2:
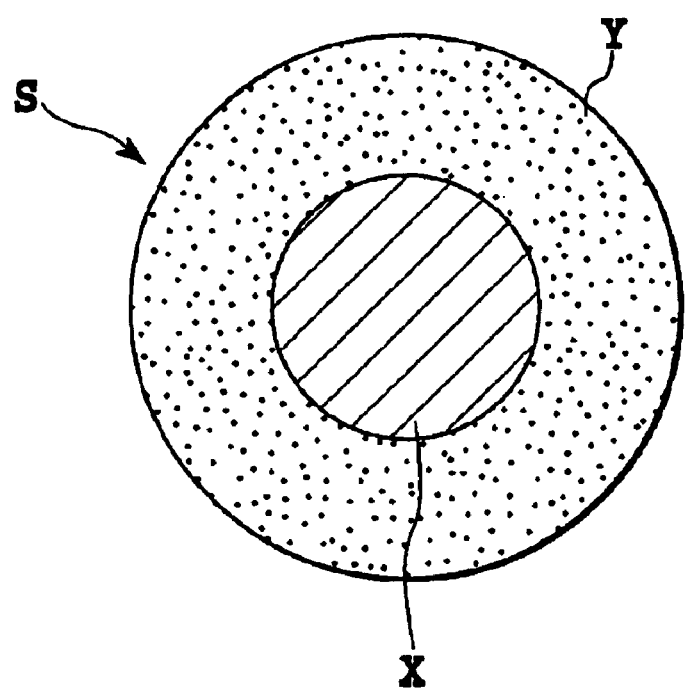
FIG. 2 is a sectional view of a hygroscopic agent included in the nonwoven fabric shown in FIG. 1.
Figure 3:
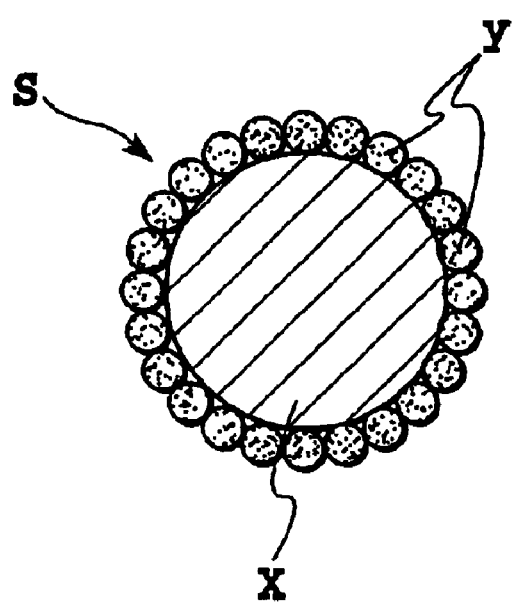
FIG. 3 is a sectional view of another hygroscopic agent.

The hygroscopic agent S adhering to fibers of the first layer 11 of the nonwoven fabric 1 maybe produced by a so-called sol-gel method. As shown in FIG. 2, a substance X having a high moisture-retaining performance, such as calcium or calcium carbonate, is wrapped with a layer Y of porous particles of, for example, silicon dioxide. In the present invention, however, the hygroscopic agent S is not limited to that shown in FIG. 2, in which the substance X is completely wrapped with the silicon dioxide layer Y. That is, as shown in FIG. 3, the hygroscopic agent S may be one in which an outer surface of the substance X having a high hygroscopic capacity is adhered with a large amount of porous particles y of silicon dioxide. Preferably, the substance X such as calcium, calcium oxide or calcium carbonate has a particle size in a range from approximately 140 to 160 μm, and the silicon dioxide particle adhering to the surface of the substance X has a particle size in a range from approximately 5 to 10 μm.

When the hygroscopic agent S shown in FIGS. 2 or 3 is left in a damp environment, the moisture in the environment is absorbed by the porous layer Y or the porous particles y, and further adsorbed and retained by the substance X such as calcium, calcium oxide or calcium carbonate, wrapped with the porous layer Y or disposed within the porous particles y. When the substance X is a calcium group, the adsorbed moisture is surely retained by the calcium group within the porous layer Y or the porous particles y unless the hygroscopic agent S is exposed to a hot environment in a range from approximately 240 to 280° C. In this regard, the substance X may be barium oxide, fluoride resin or fluorine resin besides calcium, calcium oxide or calcium carbonate.

The hygroscopic agent S included in the nonwoven fabric 1 is produced by the following process. That is, a solution is prepared by adding alcohol to alcoxysilane group such as tetramethoxysilane (TMOS) in a dry nitrogen gas environment, and proper amount water and a catalyst such as ammonium for accelerating the hydrolytic reaction and condensation reaction is added thereto and agitated. As a result, the reaction in accordance with the sol-gel method represented by the formulae (1) to (3) proceeds to produce wet gel.

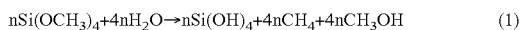
$$nSi(OCH_3)_4 + 4nH_2O \rightarrow nSi(OH)_4 + 4nCH_4 + 4nCH_3OH \quad (1)$$

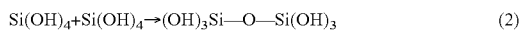
$$Si(OH)_4 + Si(OH)_4 \rightarrow (OH)_3Si\text{—}O\text{—}Si(OH)_3 \quad (2)$$

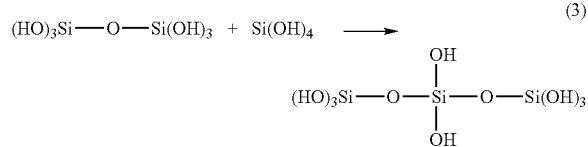

In addition, when TMOS [Si(OCH$_3$)$_4$] is used as alcoxysilane group, methanol [CH$_3$OH] is used as alcohol and ammonium [NH$_3$] is used as catalyst, a ratio by weight of these components is, preferably, Si(OCH$_3$)$_4$: H$_2$O:CH$_3$OH:NH$_3$=1:10:2.0:3.7×10$^{-4}$.

The wet gel thus produced is dried by gradually rising the environmental temperature to a range from approximately 135 to 150° C. According to this drying process, an excessive amount of alcohol (methanol), water, catalyst (ammonium) or the like are volatilized to result in porous particles of silicon dioxide. By mixing 50 to 70 parts of silicone dioxide thus produced with, for example, 50 to 30 parts of calcium oxide particles with 150 μm or more diameter, hygroscopic agent S is obtained, in which a large amount of porous particles of silicon dioxide adheres to almost all of the outer periphery of the calcium oxide having a high moisture-retaining performance. Hygroscopic agent S thus produced has both of a property for promptly adsorb moisture and a property for retaining moisture (water) until exposed to a high temperature environment.

Figure 4:
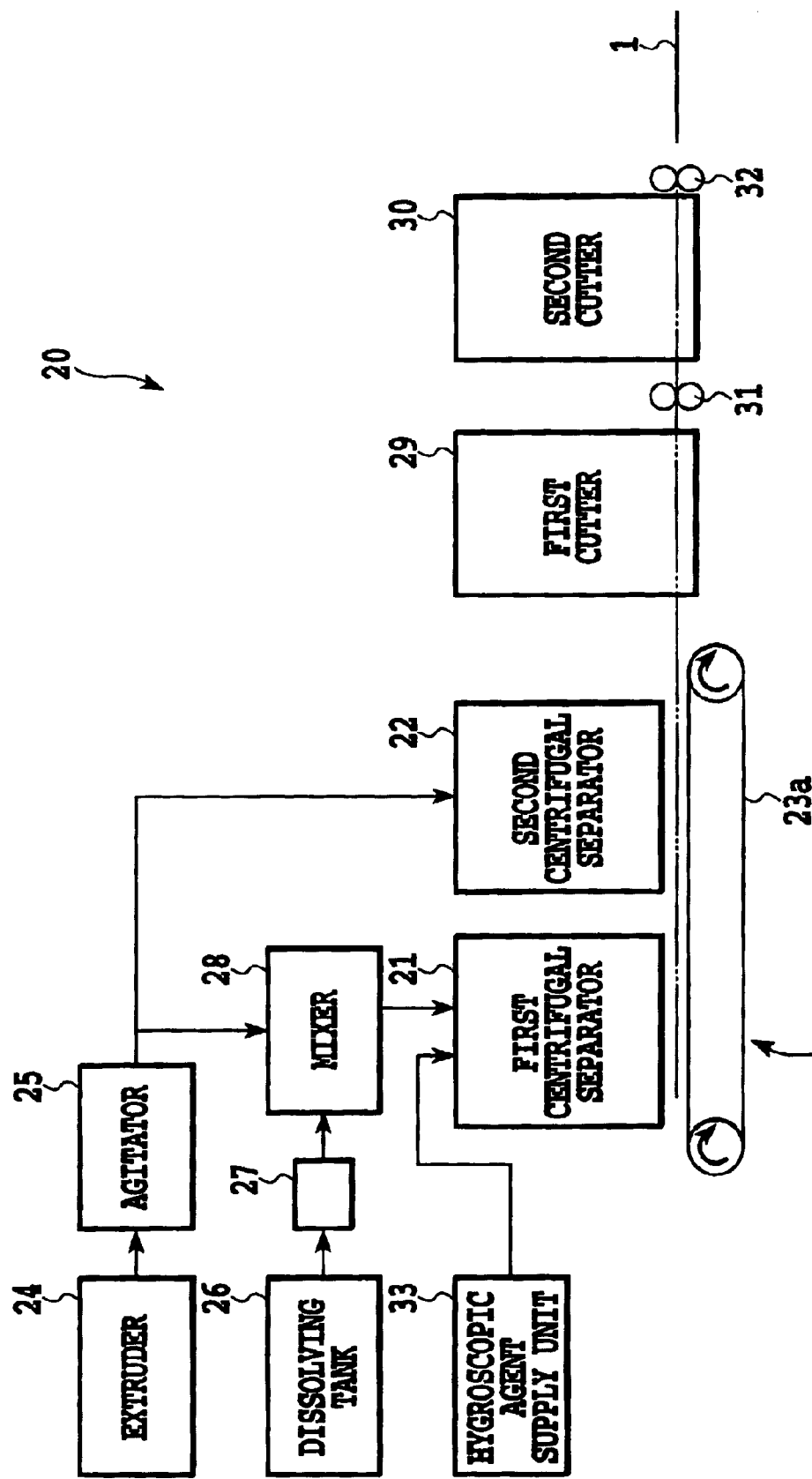
FIG. 4 is a diagrammatic view of an apparatus for producing the nonwoven fabric shown in FIG. 1.

FIG. 4 is a diagrammatic view of an apparatus for producing the nonwoven fabric 1. The apparatus 20 shown in FIG. 4 includes a first centrifugal separator 21 and a second centrifugal separator 22 for producing a nonwoven fabric structure by bonding fibers to each other, and a belt mechanism 23 having a belt 23a disposed below the first and second centrifugal separators 21 and 22 and driven to circulate. A surface of the belt 23a has a high releasability to a sticky object.

The apparatus 20 for producing the nonwoven fabric also has a raw material supplying section including an extruder 24, an agitator 25, a dissolving tank 26, a snake pump 27 and a mixer 28. The extruder 24 dissolves the raw material of fibers and supplies the same to the agitator 25. The raw material of fibers agitated by the agitator 25 is supplied to the mixer 28 and the second centrifugal separator 22. The dissolving tank 26 is used for dissolving another raw material of fibers. The raw material in the dissolving tank 26 is supplied to the mixer 28 by the snake pump 27. The raw material from the extruder 24 and the raw material from the dissolving tank 26 are mixed in the mixer 28, and thereafter, supplied to the first centrifugal separator 21.

Downstream from the second centrifugal separator 22 are disposed a first cutter 29 and a second cutter 30. The first cutter 29 cuts a continuous strip of the nonwoven fabric produced by the first centrifugal separator 21 and the second centrifugal separator 22 into pieces. The second cutter 30 cuts lateral edges (those parallel to the running direction of the belt) of the nonwoven fabric cut into pieces by the first cutter 29 so that the nonwoven fabric has a predetermined width. Further, roller pairs 31 and 32 are disposed, respectively, downstream from the first cutter 29 and the second cutter 30, for collapsing the cut edges of the nonwoven fabric.

Figure 5:
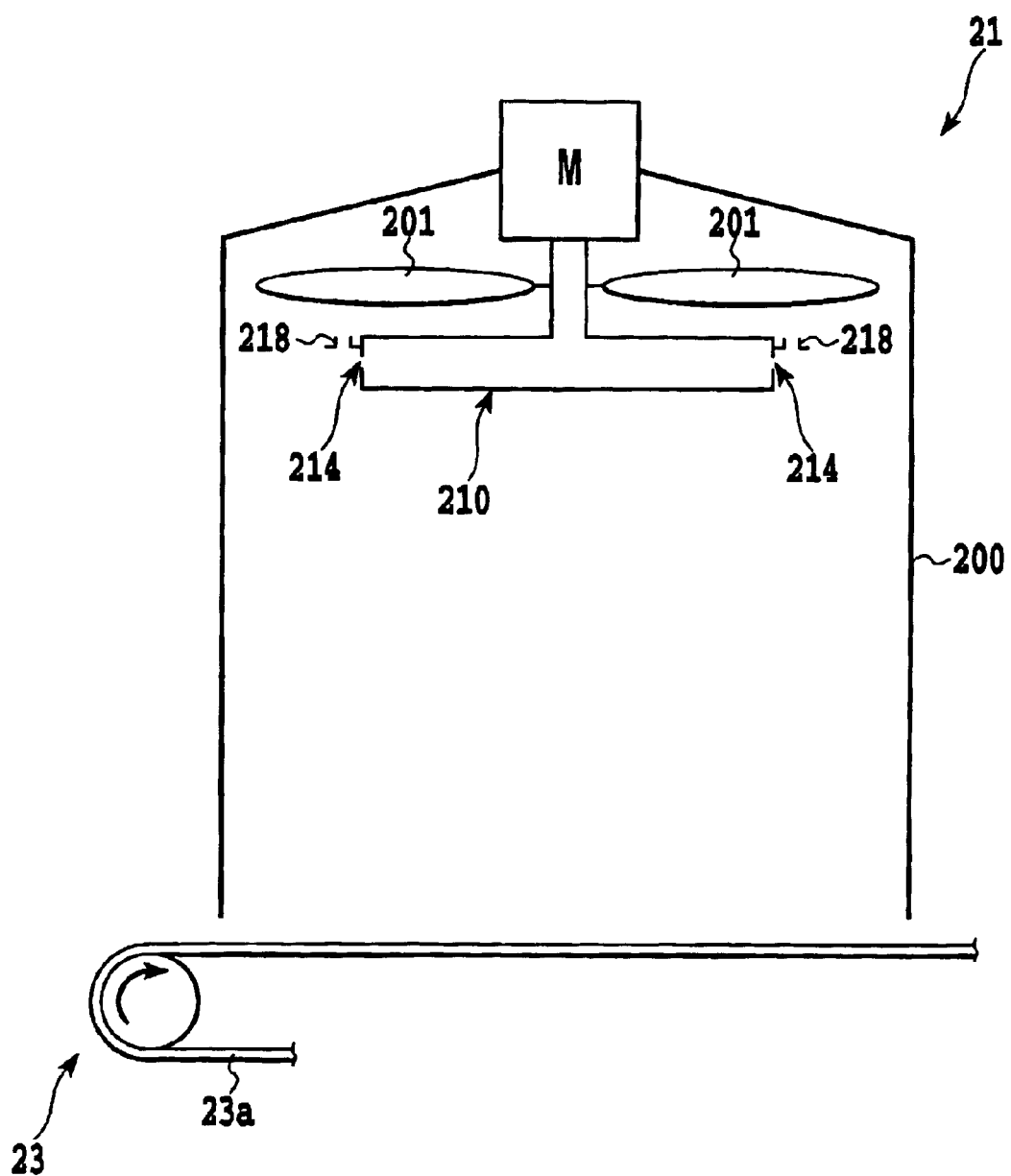
FIG. 5 is a schematic view of a first centrifugal separator in the apparatus for producing the nonwoven fabric shown in FIG. 4.
Figure 6:
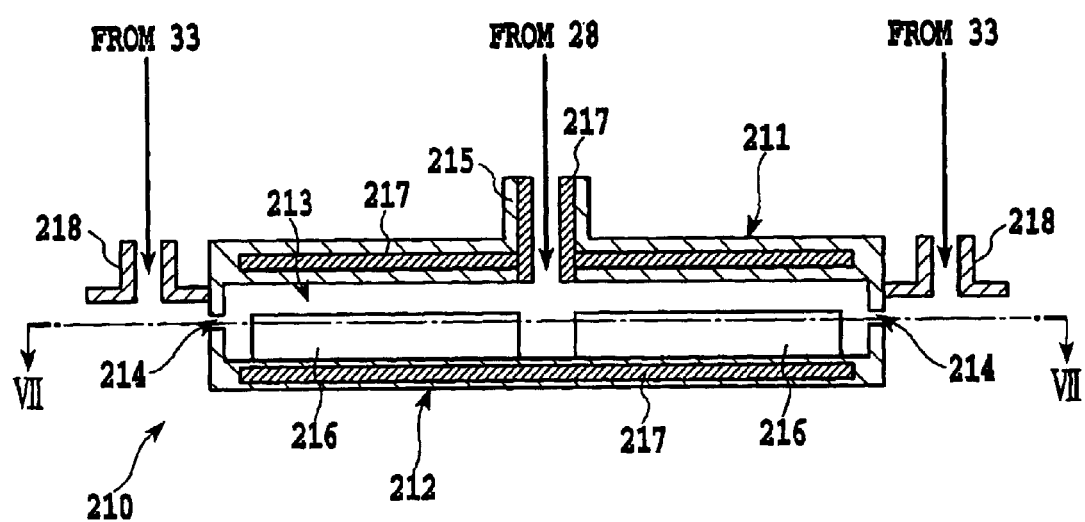
FIG. 6 is a sectional view of a rotor of the centrifugal separator shown in FIG. 5.
Figure 7:
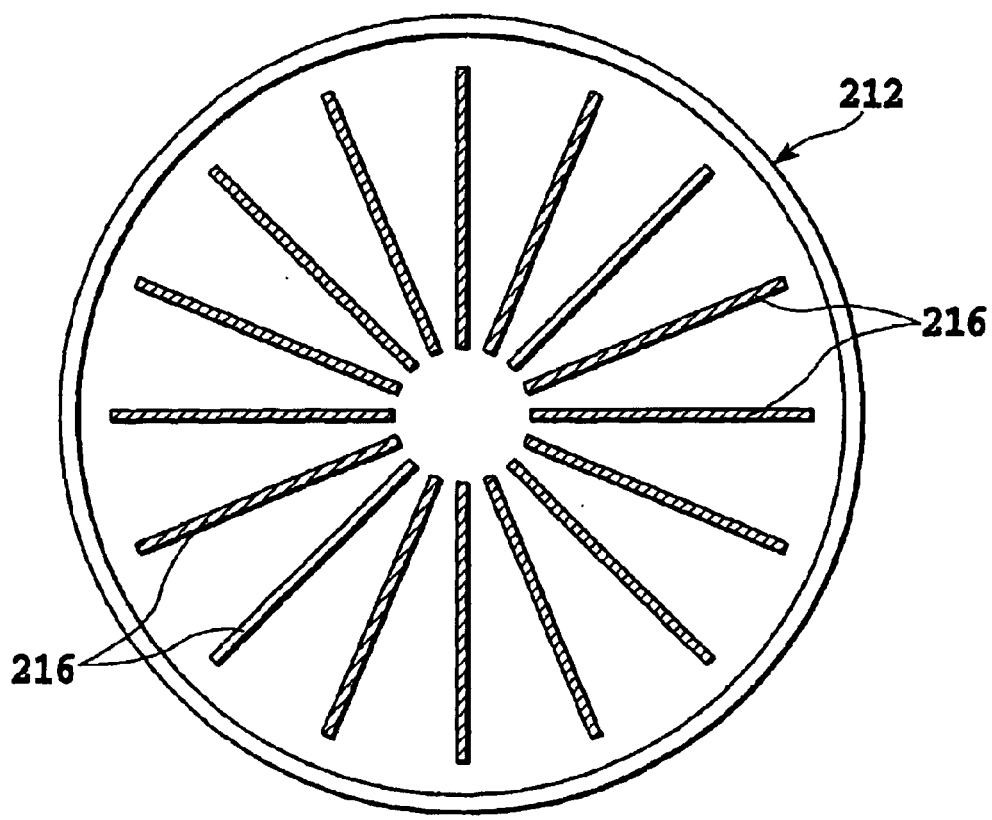
FIG. 7 is a sectional view taken along a line VII—VII in FIG. 6.

With reference to FIGS. 5 to 7, the first centrifugal separator 21 of the apparatus 20 for producing the nonwoven fabric will be described. As shown in FIG. 5, the first centrifugal separator 21 has a cylindrical main body 200. A rotor 210 is disposed in an upper area of the interior of the main body 200. The rotor 210 is driven to rotate by a motor M attached to a top portion of the main body 200. A shaft of the rotor 210 connected to a rotary shaft of the motor M is provided with a plurality of blades 201. When the motor M is operated, the blades 201 rotate together with the rotor 210 to generate a downward propelling force (toward the belt mechanism 23).

As shown in FIG. 6, the rotor 210 includes an upper half 211 and a lower half 212. The upper half 211 and the lower half 212 are fixed to each other so that an interior space is defined between the halves 211 and 212. On the outer periphery of the rotor 210, a continuous or intermittent narrow slit (slits) 214 is formed. As shown in FIG. 7, in the lower half 212 of the rotor 210, a plurality of partitioning plates 216 are radially arranged. By these partitioning plates 216, the interior space 213 of the rotor 210 is divided into a plurality of chambers. Moreover, a raw material introduction port 215 is formed in the upper half 211 of the rotor 210.

The raw material introduction port 215 is connected to the above-described mixer 28 via a duct or the like. When the nonwoven fabric 1 is produced, the raw material of fibers is introduced into the interior space 213 of the rotor 210 from the raw material introduction port 215. When the rotor 210 is driven to rotate by the motor M, fine fibers are ejected from the slit 214 via chambers between the partitioning plates 216. In addition, a heater 217 is embedded in a proper portion between the upper half 211 and the lower half 212 for heating the raw material introduced into the interior space 213.

Further, in this embodiment, a plurality of hygroscopic agent supply portions 218 are arranged in the upper half 211 of the rotor 210 for supplying hygroscopic agent. Each of the hygroscopic agent supply portions 218 is connected to a hygroscopic agent supply device 33. The hygroscopic agent S is supplied to the hygroscopic agent supply portions 218 from the hygroscopic agent supply device 33 by compressed air or the like. Then, the hygroscopic agent S is supplied to fibers ejected from the slit 214 of the rotor 210 via the hygroscopic agent supply portions 218. To uniformly adhere the hygroscopic agent S to the fibers ejected from the rotor 210, the hygroscopic agent supply portions 218 are arranged above the slit 214 in the vicinity thereof. In place of fixing the hygroscopic agent supply portions 218 to the rotor 210, the plurality of hygroscopic agent supply portions may be attached to the main body 200.

Not illustrated, the second centrifugal separator 22 basically has the same structure as the above-mentioned first centrifugal separator 21. However, the hygroscopic agent supply portion is not provided in the second centrifugal separator 22.

Next, the process will be described for producing the nonwoven fabric 1 by the above-mentioned apparatus 20.

When the nonwoven fabric 1 is produced, hard polypropylene which is a raw material of fibers for the first layer 11 and the second layer 12 is introduced into the extruder 24. The hard polypropylene is heated and molten in the extruder 24 at a temperature in a range from approximately 320 to 370° C. and delivered from the extruder 24 to the agitator 25. On the other hand, flexible atactic polymer is introduced into the dissolving tank 26 and heated and molten at a temperature in a range from approximately 230 to 250° C. The atactic polymer molten in the dissolving tank 26 is delivered from the dissolving tank 26 to the mixer 28 by the snake pump 27.

At a time when the above-mentioned temperature condition or the like have been established, the molten polypropylene being agitated in the agitator 25 is supplied to the mixer 28 and mixed with the molten atactic polymer therein. By mixing the polypropylene with the atactic polymer in such a manner, it is possible to increase the viscosity of the mixture. A mixing ratio by weight between polypropylene and atactic polymer is, preferably, polypropylene:atactic polymer=55:45 to 60:40.

When the molten polypropylene and the molten atactic polymer are sufficiently mixed in the mixer 28, the mixture of polypropylene and atactic polymer is supplied from the mixer 28 to the raw material introduction port 215 of the first centrifugal separator 21. Almost simultaneously therewith, the motor M of the first centrifugal separator 21 and the hygroscopic agent supply device 33 are operated. Also, at a proper timing prior to the supply of the raw material from the mixer 28 to the first centrifugal separator 21, the belt mechanism 23 is operated so that the belt 23a runs at a predetermined speed from the first centrifugal separator 21 toward the second centrifugal separator 22 on the side opposing to the first and second centrifugal separators 21 and 22.

When the mixture of polypropylene and atactic polymer, i.e., the raw material of fibers, is introduced into the first centrifugal separator 21 (the material introduction port 215 of the rotor 210), fibers having a high viscosity are ejected from the slit 214 of the rotating rotor 210 by the centrifugal force. Then, hygroscopic agent S is supplied from the hygroscopic agent supply portions 218 to the fibers ejected from the slit 214. As a result, the hygroscopic agent S is uniformly adhered to the fibers due to the viscosity of the fibers their own. By changing the number, position, supply amount or the like of the hygroscopic agent supply portions, an amount of the hygroscopic agent adhering to the fibers is optionally adjustable.

The fibers ejected from the slit 214 of the rotor 210 and the hygroscopic agent S adhering to the fibers descend while randomly scattering due to the downward propelling force generated by the blades 201 rotating above the rotor 210, and deposit on the belt 23a running below the first centrifugal separator 21 while being bonded with each other due to the adhesive force thereof. As a result, a layer of the nonwoven fabric (the first layer 11) made of the fibers and the hygroscopic agent S is formed on the belt 23a.

On the other hand, after the supply of the mixture of polypropylene and atactic polymer to the first centrifugal separator 21 has begun, molten polypropylene which is a raw material of fibers for the second layer 12 is supplied from the agitator 25 to the second centrifugal separator 22. Almost simultaneously therewith, a rotor (not shown) of the second centrifugal separator 22 is driven to rotate at a predetermined timing when the first layer 11 formed on the belt 23a by the first centrifugal separator 21 reaches a position below the second centrifugal separator 22.

Thus, fibers made only of polypropylene are ejected from the rotor of the second centrifugal separator 22 due to the centrifugal force and descend while randomly scattering due to the downward propelling force generated by the blades (not shown) rotating above the rotor. The fibers deposit on the first layer 11 formed on the belt 23a running below the first centrifugal separator 21 while being bonded with each other due to the adhesive force thereof. As a result, a nonwoven fabric layer (the second layer 12) made only of fibers is formed on the first layer 11. In addition, the first layer 11 and the second layer 12 are bonded together by the adhesive force of their own.

Accordingly, a strip of the nonwoven fabric including the layer of the fibers to which the hygroscopic agent S adheres and the layer of the fibers to which no hygroscopic agent S adheres is continuously formed on the belt 23a. This continuous strip of the nonwoven fabric is separated from the belt 23a by separating means (not shown) before reaching the first cutter 29, and guided to the first cutter 29. After the completion of the predetermined cutting operation carried out by the first and second cutters 29 and 30, the nonwoven fabric 1 of a desired size is obtained as shown in FIG. 4.

As described above, according to the method for producing the nonwoven fabric of the present invention, it is possible to easily, effectively and continuously produce the nonwoven fabric 1 excellent in hygroscopic capacity and handleability, which includes the hygroscopic first layer 11 of fibers to which the hygroscopic agent S adheres and the non-hygroscopic layer 12 of fibers to which no hygroscopic agent adheres. According to the above-mentioned apparatus 20 for producing the nonwoven fabric, it is possible to optionally adjust a thickness of the first and second layers 11 and 12 by changing the running speed of the belt 23a of the belt mechanism 23.

In addition, the raw material of the fibers forming the first layer 11 (including hygroscopic agent S) of the nonwoven fabric 1 may be polyethylene, polyurethane, polystyrene, polypropylene and atactic polymer, while the raw material of the fibers forming the second layer 12 (including no hygroscopic agent S) of the nonwoven fabric 1 may be polyethylene, polyurethane, polystyrene and polypropylene.

Figure 8:
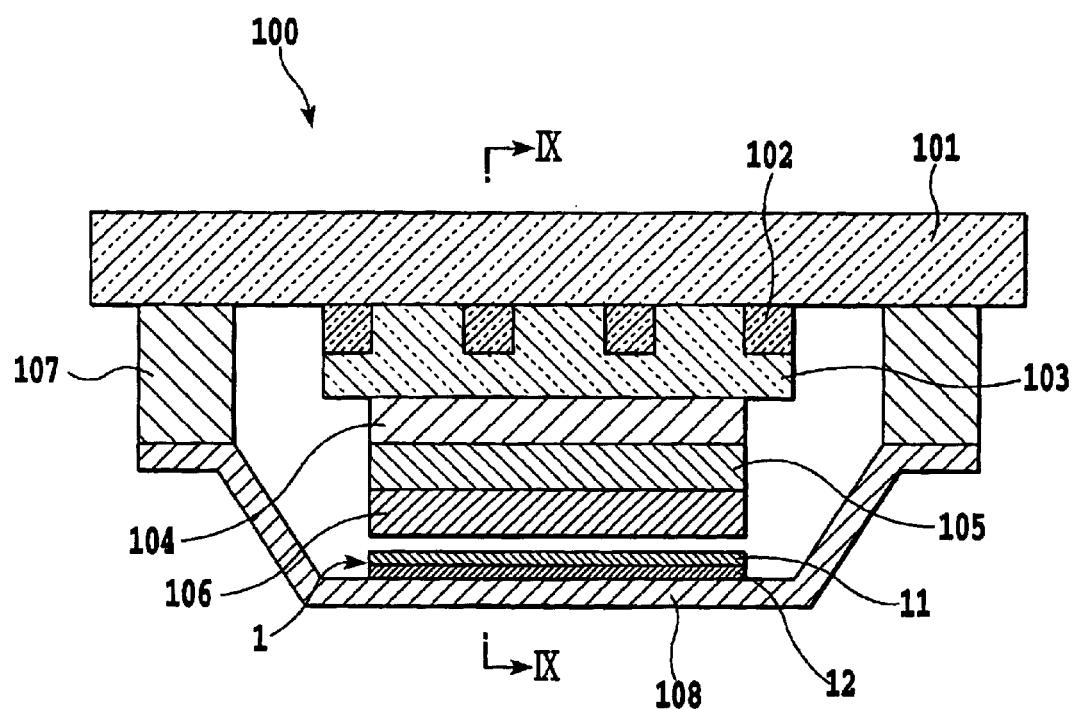
FIG. 8 is a sectional view of an organic electroluminescence display according to a first embodiment of the present invention.
Figure 9:
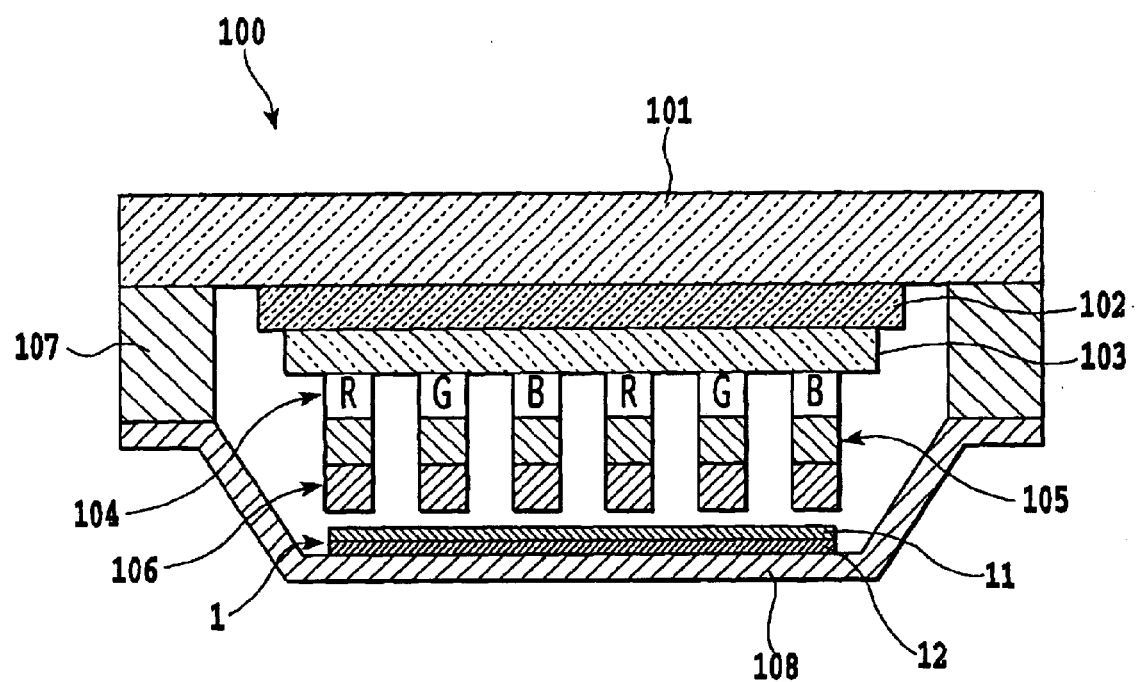
FIG. 9 is a sectional view taken along a line IX—IX in FIG. 8.

FIGS. 8 and 9 are sectional views of an organic electroluminescence display with the nonwoven fabric 1 according to the first embodiment.

The organic electroluminescence display 100 shown in FIG. 8 includes a transparent glass substrate 101 on which an ITO anode layer 102, a positive hole transition layer 103, an RGB luminescence layer 104, an electron transition layer 105 and metallic cathode layer 106, all of which are composed of organic compounds, are laminated as films. To the substrate 101, a sealing member 108 is press-bonded via an adhesive layer 107. Thus, the organic layers 102 to 105 formed on the substrate 101 are sealed with the sealing member 108. Highly pressurized $N_2$ gas or the like is sealed in the interior of the sealing member 108. In the organic electroluminescence display 100, since the sealed gas such as $N_2$ contains moisture, the above-mentioned nonwoven fabric 1 is disposed in a narrow space between the sealing member 108 and the cathode layer 106, as a hygroscopic member for absorbing and retaining moisture in the sealed gas. The nonwoven fabric 1 is fixed to the inner surface of the sealing member 108 so that the first layer 11 including hygroscopic agent S opposes to the cathode layer 106.

As described above, the organic electroluminescence display 100 is provided with the nonwoven fabric 1 serving itself as a hygroscopic member for preventing the organic compound layers 102 to 105 from being damaged by the moisture. Accordingly, it is unnecessary to attach the drying agent to a predetermined position in the sealing member for the organic electroluminescence display after being put in a package or mixed with the organic compounds as in the prior art, whereby the hygroscopic means can be easily disposed in the sealing member 108. Also, the hygroscopic capacity, size or thickness of the nonwoven fabric 1 is easily and freely adjustable in accordance with an amount of hygroscopic agent S which adheres to fibers (the first layer 11), and the nonwoven fabric 1 has a high general versatility, productivity and handleability. Therefore, it is unnecessary to provide the attachment portion for the drying agent in the sealing member 108 of the organic electroluminescence display 100. As a result, the complexity of the prior art production process of the organic electroluminescence display caused by the arrangement of the drying agent can be reduced and the organic electroluminescence display 100 can be thin in thickness as a whole. Also, in the organic electroluminescence display 100, the deterioration due to moisture, such as the generation of dark spot can be surely prevented by the nonwoven fabric 1 (the first layer 11) serving as a hygroscopic member.

(Second Embodiment)

Figure 10:
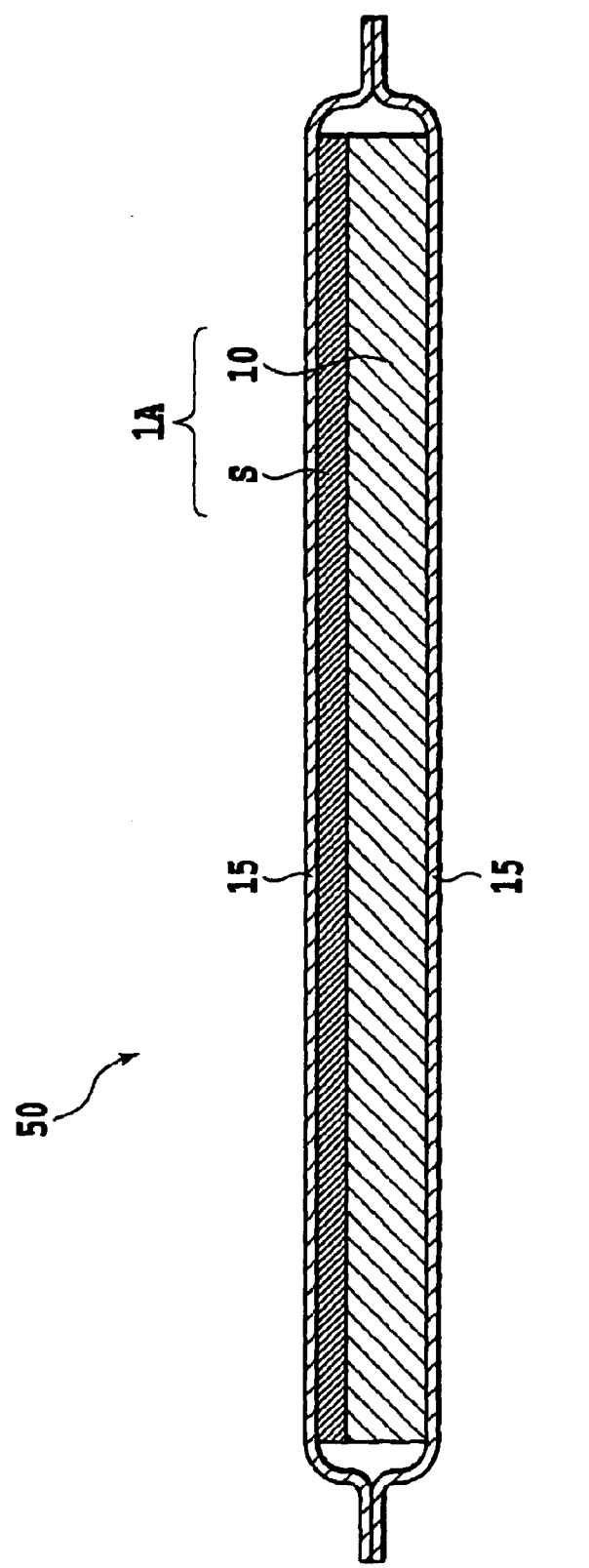
FIG. 10 is a sectional view of a hygroscopic member with a nonwoven fabric according to a second embodiment of the present invention.

FIG. 10 is a sectional view illustrating a hygroscopic member with a nonwoven fabric according to a second embodiment of the present invention. The hygroscopic member 50 shown in FIG. 10 includes a nonwoven fabric 1A. Above-described hygroscopic agent S adheres to at least part of fibers of the nonwoven fabric 1A. As seen from FIG. 10, the nonwoven fabric 1A includes a fiber layer 10 formed by bonding fibers to each other and hygroscopic agent S forming a hygroscopic layer on one surface of the fiber layer 10. The fiber layer 10 has a thickness, for example, of approximately 2 mm and is flexible and thin. Hygroscopic agent S may be one in which substance X high in moisture-retaining performance, such as calcium, calcium oxide or calcium carbonate is wrapped with a layer Y of porous particles of silicon dioxide (see FIG. 2) or one in which a much amount of porous particles y of silicon dioxide adheres to almost all the outer periphery of the substance X such as calcium, calcium oxide or calcium carbonate (see FIG. 3).

In the hygroscopic member 50, the entirety of the nonwoven fabric 1A cut into a predetermined size is covered with an air-permeable sheet 15. According to this embodiment, a porous sheet made of plastic (for example, polypropylene) having an air permeability of 98% or more is employed as the air-permeable sheet 15. The air-permeable sheet 15 is disposed to cover both of upper and lower surfaces of the nonwoven fabric 1, and the upper and lower parts of the air-permeable sheet 15 are heat-bonded to each other along all over the circumference of the nonwoven fabric 1A. Thus, the hygroscopic agent S is left within the air-permeable sheet 15 of a bag shape even if the hygroscopic agent S is separated from the fiber layer 10. Therefore, the hygroscopic capacity of the hygroscopic agent 50 is maintained for a long period.

Figure 11:
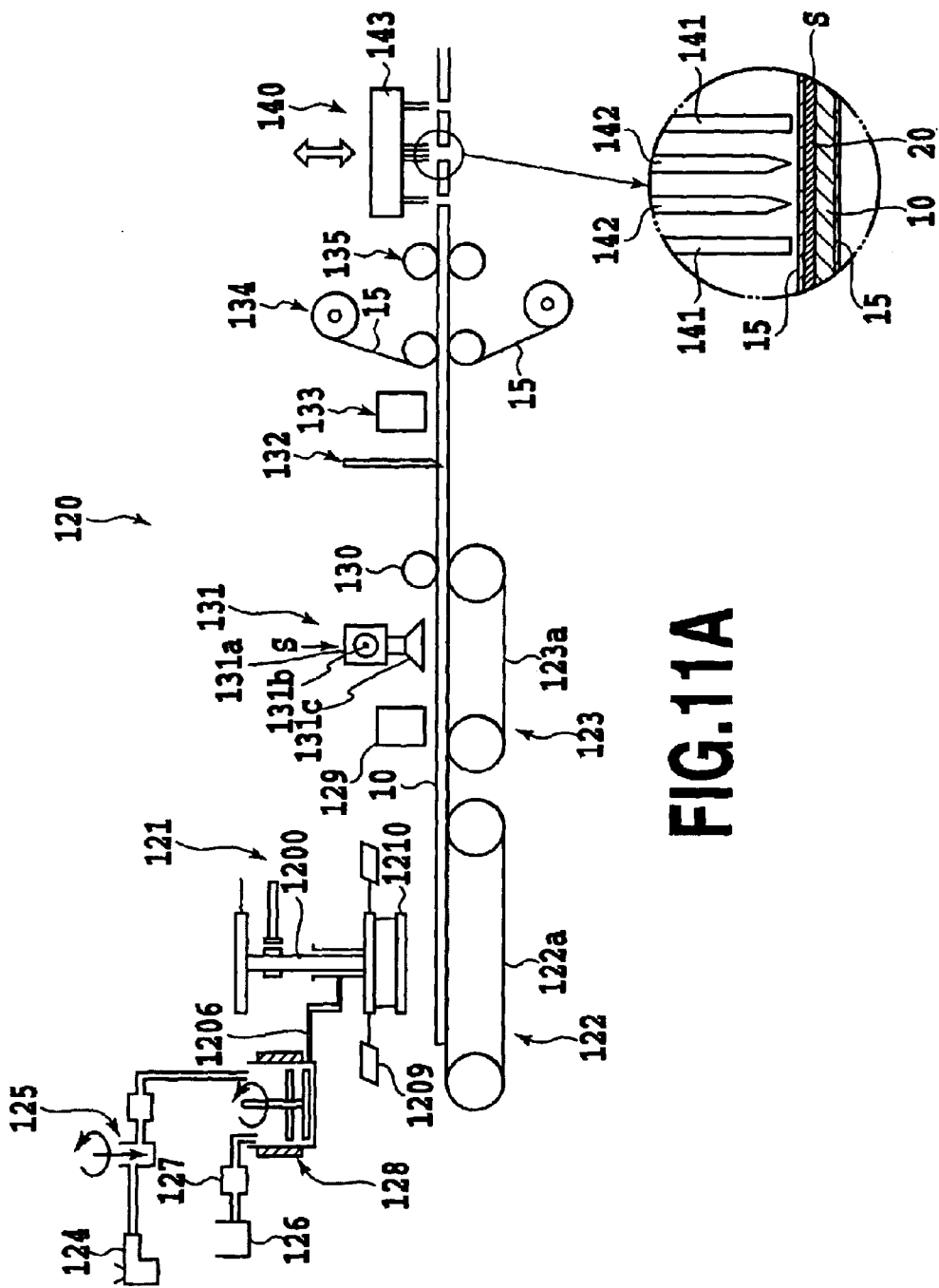
FIG. 11A is a diagrammatic view of an apparatus for producing the nonwoven fabric shown in FIG. 10
FIG. 11B is an enlarged view of the apparatus of FIG. 11A.

FIG. 11A is a diagrammatic view of an apparatus for producing the above-mentioned nonwoven fabric 1A. The apparatus 120 shown in FIG. 11A includes a centrifugal separator 121 for producing a sheet-like fiber layer 10 (a nonwoven fabric structure) by bonding fibers to each other, a belt mechanism 122 below the centrifugal separator 121, and a belt mechanism 123 disposed downstream from the belt mechanism 122. The belt mechanisms 122 and 123 respectively have belts 122a, 123a driven to circulate. Surfaces of the belts 122a and 123a has a high releasability to a sticky object.

Also, the apparatus 120 has a raw material supply section for supplying raw material of fibers forming the nonwoven fabric 1A. The raw material supply section includes an extruder 124, an agitator 125, a dissolving tank 126, a snake pump 126 and a mixer 128. The extruder 124 melts the raw material of fibers and supplies the same to the agitator 125. The raw material of fibers agitated by the agitator 125 is supplied to the mixer 128. The dissolving tank 126 is used for dissolving other raw material for forming fibers. The raw material in the dissolving tank 126 is introduced into the mixer 128 by the snake pump 127. The raw material from the extruder 124 and the raw material from the dissolving tank 126 are mixed in the mixer 128, and thereafter supplied to the centrifugal separator 121.

Downstream from the centrifugal separator 121, a heating device 129, a hygroscopic agent spraying device 131 and a roller pair 130 are sequentially arranged from the upstream to be located above the belt mechanism 123. 10 The heating device 129 heats the fiber layer 10 which is formed on the belt 122a of the belt mechanism 122 and transferred to the belt 123a of the belt mechanism 123. The hygroscopic agent spraying device 131 includes a casing 131a disposed generally perpendicular to the running direction of the belt 123a or the like, and a screw 131b driven to rotate within the casing 131a.

In the casing 131a of the hygroscopic agent spraying device 131, a slit extending generally perpendicular to the running direction of the belt 123a or the like, or a plurality of holes arranged generally perpendicular to the running direction of the belt 123a or the like are formed so as to oppose to the upper surface of the belt 123a. The hygroscopic agent S is introduced into the casing 131a of the hygroscopic agent spraying device 131 at the same time as the rotation of the screw 131b. As a result, it is possible to uniformly spray hygroscopic agent S onto the fiber layer 10 on the belt 123a to produce the non-woven fabric 1A. In addition, a nozzle 131c for preventing the excessive diffusion of hygroscopic agent S is attached to the casing 131a.

Downstream from the hygroscopic agent spraying device 131, a hot wire cutter 132 is disposed for cutting off the lateral edges (edges parallel to the running direction of the belt mechanism 123 or the like) of the nonwoven fabric 1A conveyed by the belt mechanism 123 or the like. In this case, preferably, the excessive fibers cut off by the cutter 132 is dissolved in the dissolving tank 26 and used again. Downstream from the cutter 132, a heating device 133 and a sheet supplying device 134 are sequentially arranged. The heating device 133 blows hot air onto the nonwoven fabric 1A. The sheet supplying device 134 supplies the air-permeable sheet 15 onto the upper and lower surfaces of the fiber layer 10 transferred from the belt mechanism 123. The heating device 133 may be omitted from the apparatus 120.

Figure 12:
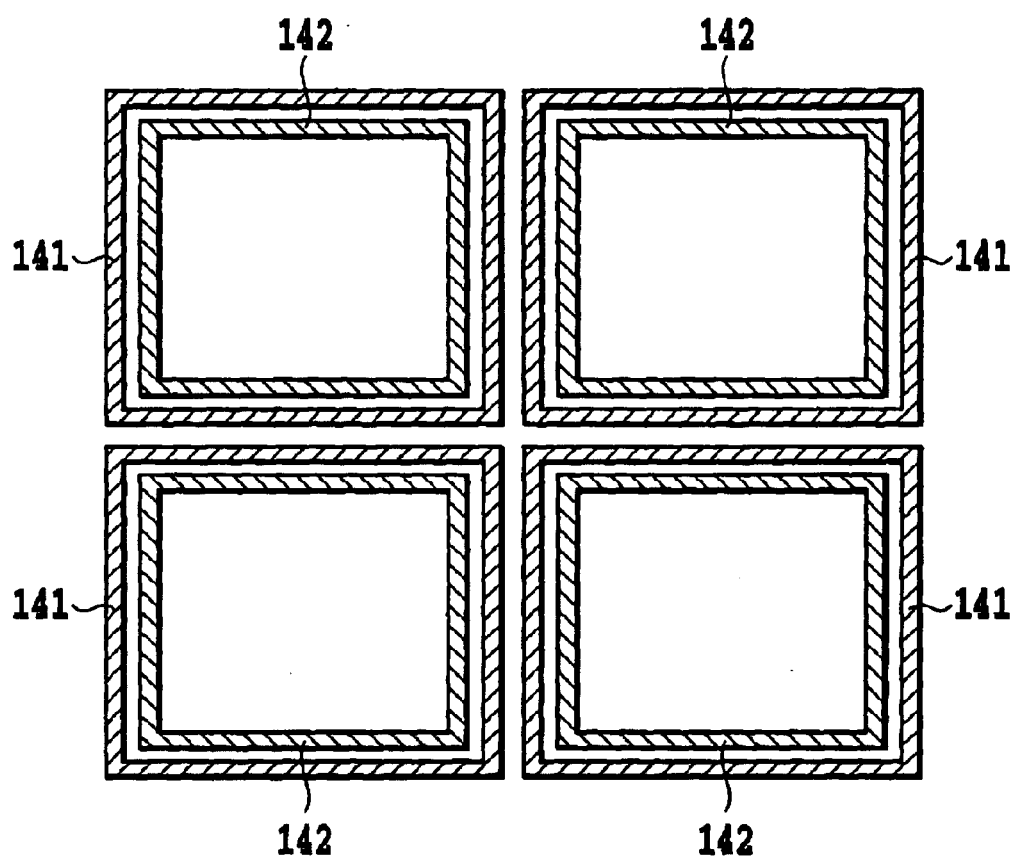
FIG. 12 is a schematic view for explaining a thermo-compressive bonding and cutting device in the apparatus for producing the nonwoven fabric shown in FIG. 11A.

Downstream from the sheet supplying device 134, a roller pair 135 and a hot press-bonding and cutting device 140 are sequentially arranged. As shown in FIGS. 11A, 11B and 12, the hot press-bonding and cutting device 140 includes a plurality of (four in this embodiment) seal heater 141 and a plurality of (four in this embodiment) heat cutters 142. Each of the seal heaters 141 has a generally rectangular cross-section for hot-melting an air-permeable sheet 15 made of plastic. Each of the heat cutters 142 has a generally rectangular cross-section and is disposed outside the respective seal heater 141 at a predetermined interval. Sets of the seal heater 141 and the heat cutter 142 are arranged in a grid pattern at a small interval as shown in FIG. 12. Further, the hot press-bonding and cutting device 140 has a drive mechanism 143 for moving the respective seal heaters 141 and the heat cutters 142 together with respect to the nonwoven fabric 1A.

Figure 13:
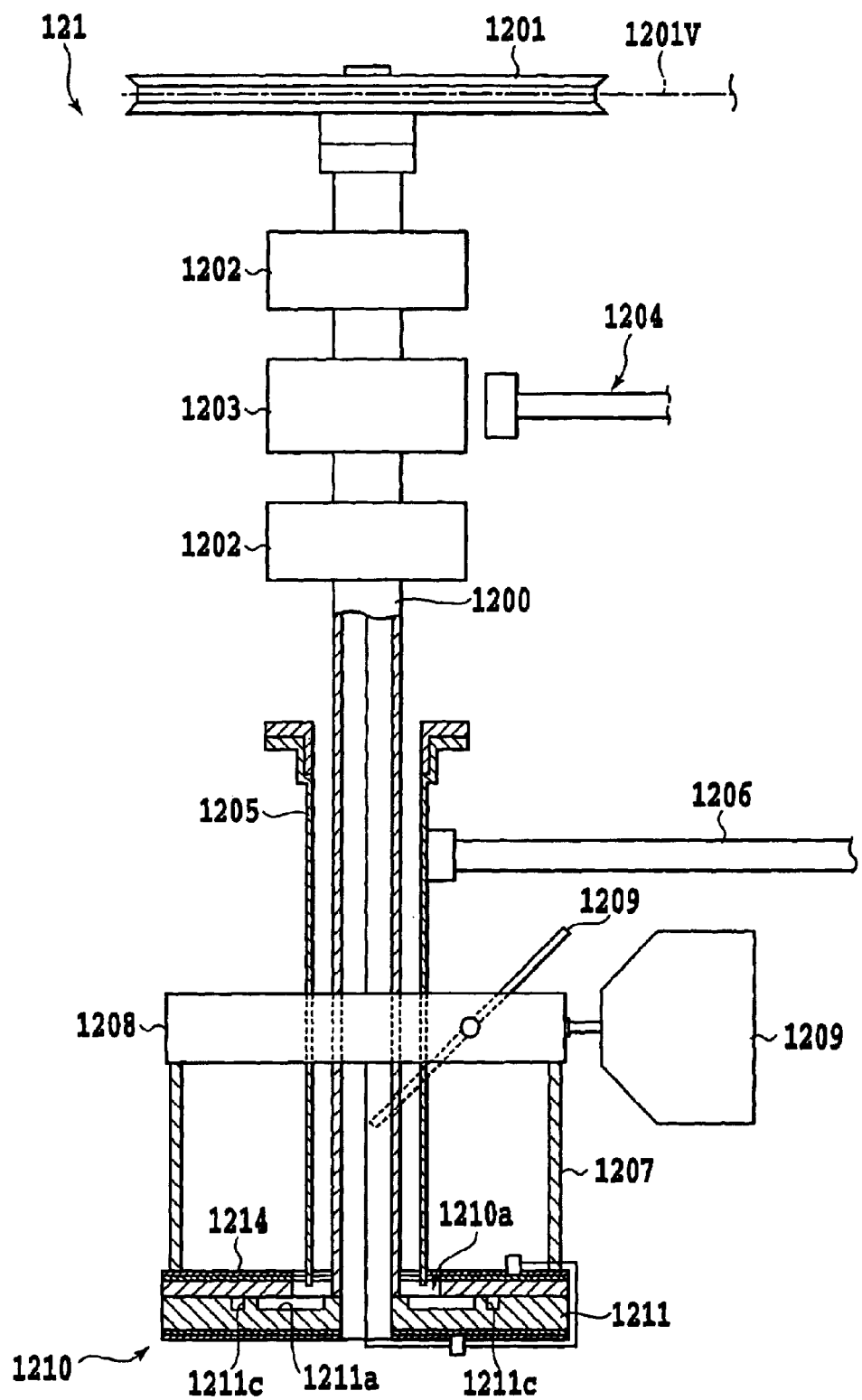
FIG. 13 is a partially sectional view of a centrifugal separator of the apparatus for producing the nonwoven fabric shown in FIG. 10.

The centrifugal separator 121 in the apparatus 120 for producing the nonwoven fabric will be explained with reference to FIGS. 13 to 15. As shown in FIG. 13, the centrifugal separator 121 has a hollow rotary shaft 1200 and a rotor 1210 fixed to one end (a lower end) of the rotary shaft 1200. The rotary shaft 1200 is rotatably supported by a support member (not shown) at a predetermined position above the belt mechanism 122 and has a pulley 1201 at the other end thereof. The rotary shaft 1200 and the rotor 1210 are drive to rotate by a motor (not shown) or the like via the pulley 1201 and a belt 1201V. Two balance weights 1202 are fixed to the upper portion of the rotary shaft 1200 and a slip ring 1203 for supplying electric power is fixed between both the balance weights 1202. The slip ring 1203 is opposed to an electric power supplying member 1204 at a predetermined interval. The supplying member 1204 is connected to an electric power source disposed in the vicinity of the centrifugal separator 121.

Figure 14:
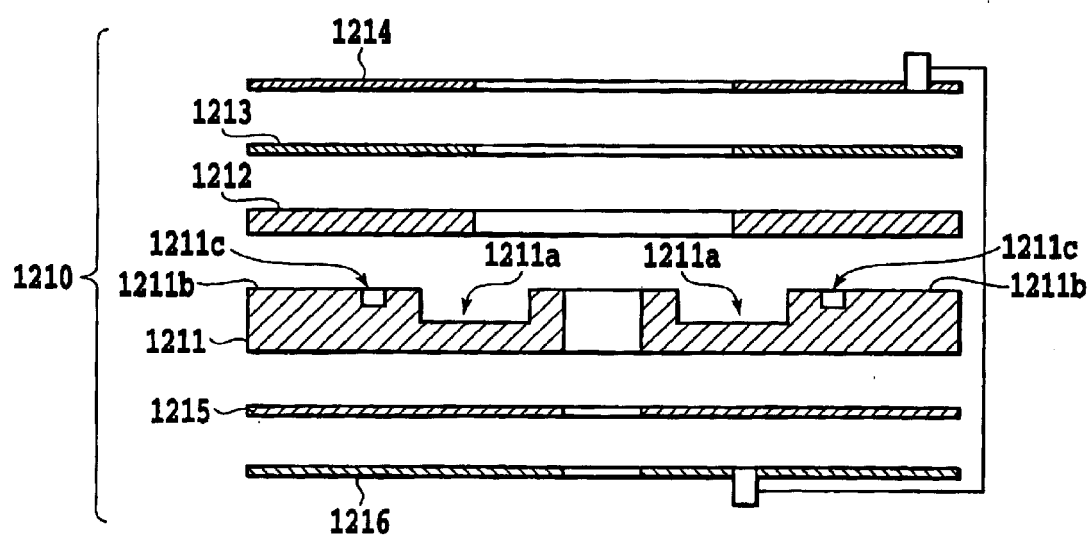
FIG. 14 is an exploded view for explaining a rotor of the centrifugal separator shown in FIG. 13.
Figure 15:
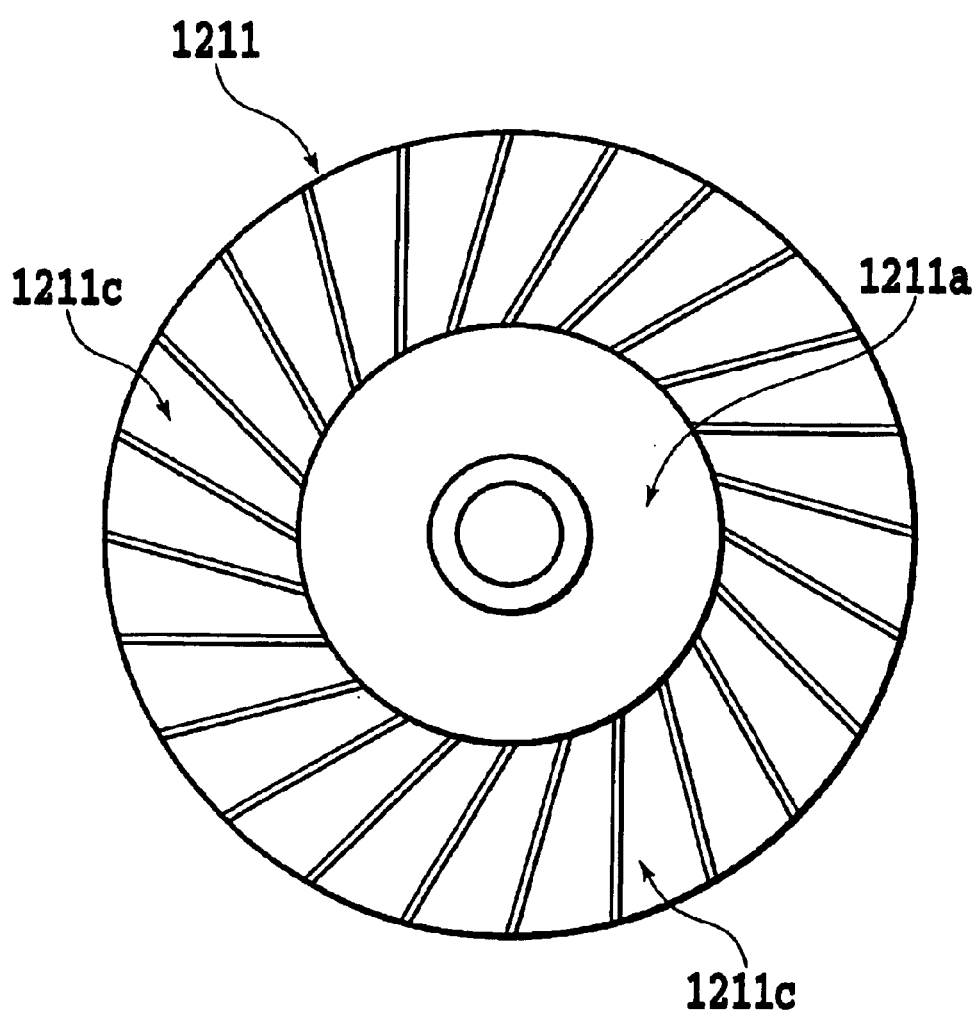
FIG. 15 is a plan view for explaining the rotor in FIG. 14.

As shown in FIG. 14, the rotor 1210 includes a plurality of annular plate members having same outer diameter. That is, the rotor 1210 includes an annular main body 1211 having a recessed portion 1211a formed on the periphery of a central opening. Also as shown in FIGS. 14 and 15, on a surface of an outer periphery portion 1211b of the main body 1211 located around the recessed portion 1211a, a plurality of grooves 1211c are formed to communicate with the recessed portion 1211a. As seen from FIG. 15, each of the grooves 1211c is formed to incline at a predetermined angle to the radial direction.

On the upper surface of the body 1211, an annular plate 1212 is fixed for covering the respective grooves 1211c. The annular plate 1212 has an opening having an outer diameter smaller than that of the recessed portion 1211a and larger than that of the rotary shaft 1200. Further, on the upper surface of the annular plate 1212, an upper heater 1213 having an annular shape is fixed. A central opening of the upper heater 1213 has an inner diameter equal to that of the opening of the annular plate 1212. On the upper surface of the upper heater 1213, an annular upper outer plate 1214 is fixed. A central opening of the upper outer plate 1214 also has an inner diameter equal to those of the annular plate 1212 and the upper heater 1213.

On the other hand, on a lower surface of the main body 1211, a lower heater 1215 having an annular shape is fixed, and on a lower surface of the lower heater 1215, an annular lower outer plate 1216 is fixed. An electric power is supplied to the upper heater 1213 and the lower heater 1215 of the rotor 1210 via the electric power supplying member 1204, the slip ring 1203 and an electric cable disposed in the interior of the rotary shaft 1200.

As seen from FIGS. 13 and 14, the rotor 1210 has an annular space 1210a defined by the openings of the annular plate 1212, the upper heater 1213 and the upper outer plate 1214. Part of the recessed portion 1211a of the body 1211 is opened to outside via this annular space 1210a. One end of the rotary shaft 1200 is inserted into the annular space 1210a and firmly fixed to the center of the body 1211 of the rotor 1210.

Further, as shown in FIG. 13, the centrifugal separator 121 has a tubular member 1205 having an inner diameter larger than the outer diameter of the rotor 1200 but having an outer diameter smaller than the inner diameter of the annular space 1210a of the rotor 1210. The tubular member 1205 is positioned with respect to the centrifugal separator 121 to be located at a position between the lower balance weight 1202 as seen in the drawing and the rotor 1210. One end (a lower end) of the tubular member 1205 reaches the interior of the annular space 1210a while not being in contact with the rotor 1210.

The interior of the tubular member 1205 is communicated to the above-mentioned mixer 128 via duct 1206. When the nonwoven fabric 1A is produced, the raw material of fibers is introduced from the mixer 128 into a space (a raw material introduction section) formed between the inner surface of the tubular member 1205 and the outer surface of the rotary shaft 1200. The raw material introduced into the tubular member 1205 flows into the recessed portion 1211a via the annular space 1210a of the rotor 1210, and further into the respective grooves 1211c from the recessed portion 1211a. Accordingly, when the rotor 1210 is driven to rotate, fine fibers are ejected from each of the grooves 1211c.

Moreover, an annular blade holding member 1208 is fixed to the upper outer plate 1214 of the rotor via a tubular spacer 1207. A plurality of (eight in this embodiment) blades 1209 are attached to the blade holding member 1208 at a predetermined interval between them. Each of the blades 1209 rotates together with the rotor 1210 and generates the downward propelling force as seen in FIG. 13 (in the direction toward the belt mechanism 122). In addition, the attachment angle of each blade 1209 with respect to the blade holding member 1208 is freely variable in this embodiment.

Next, the process for producing the hygroscopic member 50 including the nonwoven fabric 1A by using the above-mentioned apparatus 120 will be described.

When the hygroscopic member 50 is produced, first, hard polypropylene is introduced into the extruder 124 and flexible atactic polymer is introduced into the dissolving tank 126. The hard polypropylene is heated and molten in the extruder 124 at a temperature in a range from approximately 320 to 370° C., and delivered from the extruder 124 to the agitator 125. On the other hand, the atactic polymer is heated and molten at a temperature in a range from approximately 230 to 250° C. and delivered from the dissolving tank 126 to the mixer 128 by the snake pump 127.

In addition, various devices and ducts for supplying the raw material of fibers to the centrifugal separator 121 are provided with heaters (not shown) for the purpose of heating the raw material and maintaining such a heated state. The raw material of fibers forming the fiber layer 10 of the nonwoven fabric 1A may be polyethylene, polyurethane or polystyrene besides polypropylene and atactic polymer.

The molten polypropylene is agitated in the agitator 125, and thereafter, supplied to the mixer 128 in which it is mixed with the molten atactic polymer. By mixing polypropylene with atactic polymer in such a manner, it is possible to increase the adhesion of the mixture. A mixing ratio by weight of polypropylene and atactic polymer is, for example, polypropylene:atactic polymer=55:45 to 65:35.

When the molten polypropylene and the molten atactic polymer have been sufficiently mixed in the mixer 128, the mixture of polypropylene and atactic polymer is supplied from the mixer 128 to the interior of the tubular member 1205. Also, at a proper timing prior to the supply of the raw material from the mixer 128 to the centrifugal separator 121, the belt mechanisms 122 and 123 are operated to run the belts 122a and 123a at a predetermined speed.

When the rotary shaft 1200 of the centrifugal separator 121 is driven to rotate at a predetermined timing, highly viscous fibers are ejected from the grooves 1211c of the rotating rotor 1210 by the centrifugal force. The fibers ejected from the rotor 1210 descend while randomly scattering due to the downward propelling force generated by the blades 1209 rotating above the rotor 1210, and deposit on the belt 22a running below the centrifugal separator 121 while bonding to each other due to the adhesive force thereof. As a result, the fiber layer 10 is formed on the belt 122a.

The fiber layer 10 formed on the belt 122a is compressed to have a uniform thickness by a roller pair (not shown) disposed between the belt mechanisms 122 and 123. Then, the fiber layer 10 is conveyed below the heating device 1209 and heated therein. As a result, the adhesive force of the fibers increases again to accelerate the bonding of the fibers, even if the adhesive force has been lowered by an air flow generated by the blades 1209. In this embodiment, the heating device 129 blows hot air at a temperature in a range from approximately 200 to 230° C. to the fiber layer 10.

The hygroscopic agent S is uniformly sprayed from the hygroscopic agent spraying device 131 to the fiber layer 10 heated by the heating device 129. The hygroscopic agent S uniformly adheres to the fibers recovering the adhesion by being heated with the heating device 129. Further, the roller pair 130 compresses the fiber layer 10 and the hygroscopic agent S so that the hygroscopic agent S firmly adheres to the fiber layer 10. An amount or the like of the hygroscopic agent S to be adhered to the fiber layer 10 may be optionally variable by changing a supply amount of hygroscopic agent S to the device 131 or the delivery speed of the screw 131b. Consequently, the fiber layer 10 in which the hygroscopic agent S adheres to one surface thereof, that is, the flexible and thin nonwoven fabric 1A excellent in hygroscopic property is easily, effectively and continuously formed on the belt 123a.

The nonwoven fabric 1A is continuously produced as described above and further compressed by a roller pair 130 disposed downstream from the hygroscopic agent spraying device 131. The lateral edges of the nonwoven fabric 1A are cut off by the cutter 132. Then, the heating device 133 disposed downstream from the cutting device 132 blows hot air onto the nonwoven fabric 1A so that the nonwoven fabric 1A comes to have the adhesion as a whole. Further, the air-permeable sheets 15 are supplied to the upper and lower surfaces of the nonwoven fabric 1A heated by the heating device 133 from the sheet supply device 134. The nonwoven fabric 1A and the upper and lower air-permeable sheets 15 are compressed by the roller pair 135 so that air remaining between the nonwoven fabric 1A and the air-permeable sheets 15 is pushed out.

When the nonwoven fabric 1A and the air-permeable sheets 15 have passed the roller pair 135, the hot press-bonding and cutting device 140 is operated. The nonwoven fabric 1A including the fiber layer 10 to which the hygroscopic agent S adheres and the air-permeable sheet 15 is cut into pieces of a predetermined number and size by the respective heat cutters 142. Simultaneously, the outer peripheries of the upper and lower air-permeable sheets 15 are hot-bonded together by the respective seal heaters 141 so that the piece of the nonwoven fabric 1A is completely sealed.

Thus, according to the apparatus 120 for producing the nonwoven fabric, it is possible to effectively produce the hygroscopic member 50 of a small size capable of maintaining a high hygroscopic property for a long period. A temperature of the seal heater 141 for hot press-bonding the air-permeable sheet 15 is preferably in a range from approximately 180 to 220° C., while a temperature of the heat cutter 142 for cutting the nonwoven fabric 1A and the air-permeable sheet 15 is preferably in a range from approximately 260 to 280° C.

Figure 16:
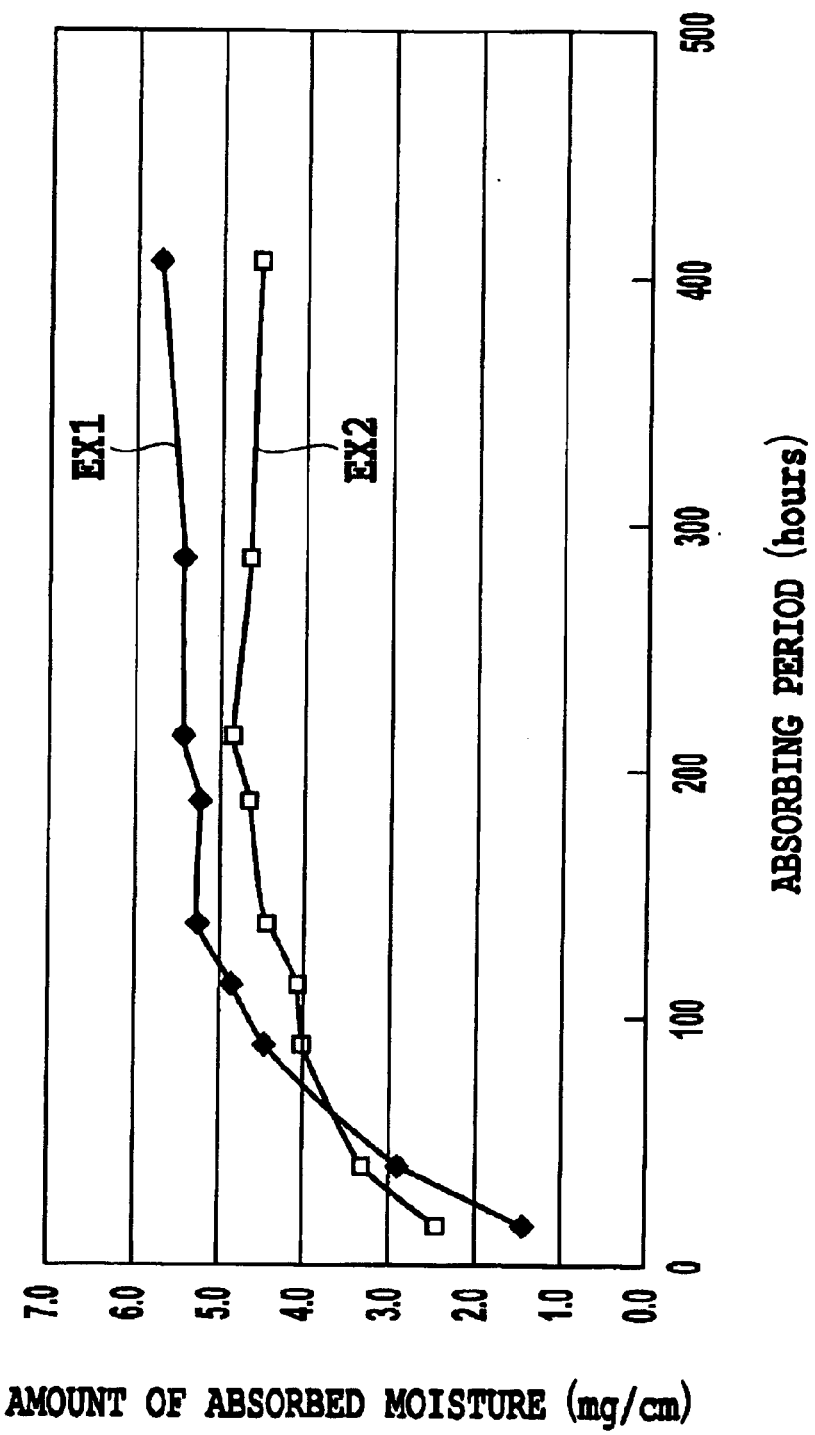
FIG. 16 is graphs showing an amount of absorbed moisture when changing a ratio by weight between calcium oxide and silicon dioxide in a hygroscopic agent included in the hygroscopic member according to the second embodiment of the present invention.

FIG. 16 is graphs showing an amount of the adsorbed moisture when changing a ratio by weight of the substance X (calcium oxide) and the porous particles y of silicon dioxide in the hygroscopic agent included in the nonwoven fabric 1A of a hygroscopic member 50 according to a second embodiment. In this case, a hygroscopic member EX1 included the nonwoven fabric 1A having the hygroscopic agent S of approximately 0.6 g prepared so that a ratio by weight of calcium oxide and porous particles of silicon dioxide becomes 70:30 and the air-permeable sheet 15 covering the nonwoven fabric 1A. Also, another hygroscopic member EX2 included the nonwoven fabric 1A including the hygroscopic agent S of approximately 0.6 g prepared so that a ratio by weight of calcium oxide and porous particles of silicon dioxide becomes 30:70 and the air-permeable sheet 15 covering the nonwoven fabric 1A.

These two kinds of hygroscopic members EX1 and EX2 were left in a sealed container conditioned at room temperatures and a humidity of 80%, and an amount of adsorbed moisture was measured at preset times. The amount of adsorbed moisture was measured at times 18 hours, 42 hours, 90 hours, 114 hours, 140 hours, 189 hours, 217 hours, 289 hours and 409 hours after the hygroscopic members EX1 and EX2 have been left in the sealed container. The hygroscopic members EX1 and EX2 respectively have a dimension of 5 cm length×5 cm width and 2 mm thick.

As seen from the results of FIG. 16, the hygroscopic member EX1 including more silicon dioxide than calcium oxide is inferior in an initial amount of adsorbed moisture to the hygroscopic member EX2 including more calcium oxide than silicon dioxide when they are left in the damp environment. However, the hygroscopic member EX1 including more silicon dioxide than calcium oxide is superior to the hygroscopic member EX2 in an amount of adsorbed moisture after they have been left in this environment for a long period. Accordingly, in order to maintain the hygroscopic capacity in a favorable state for a long period, it is preferable to use hygroscopic agent S prepared so that an amount of the substance X (calcium oxide or the like) is more than that of silicon dioxide as in the hygroscopic member EX1.

Figure 17:
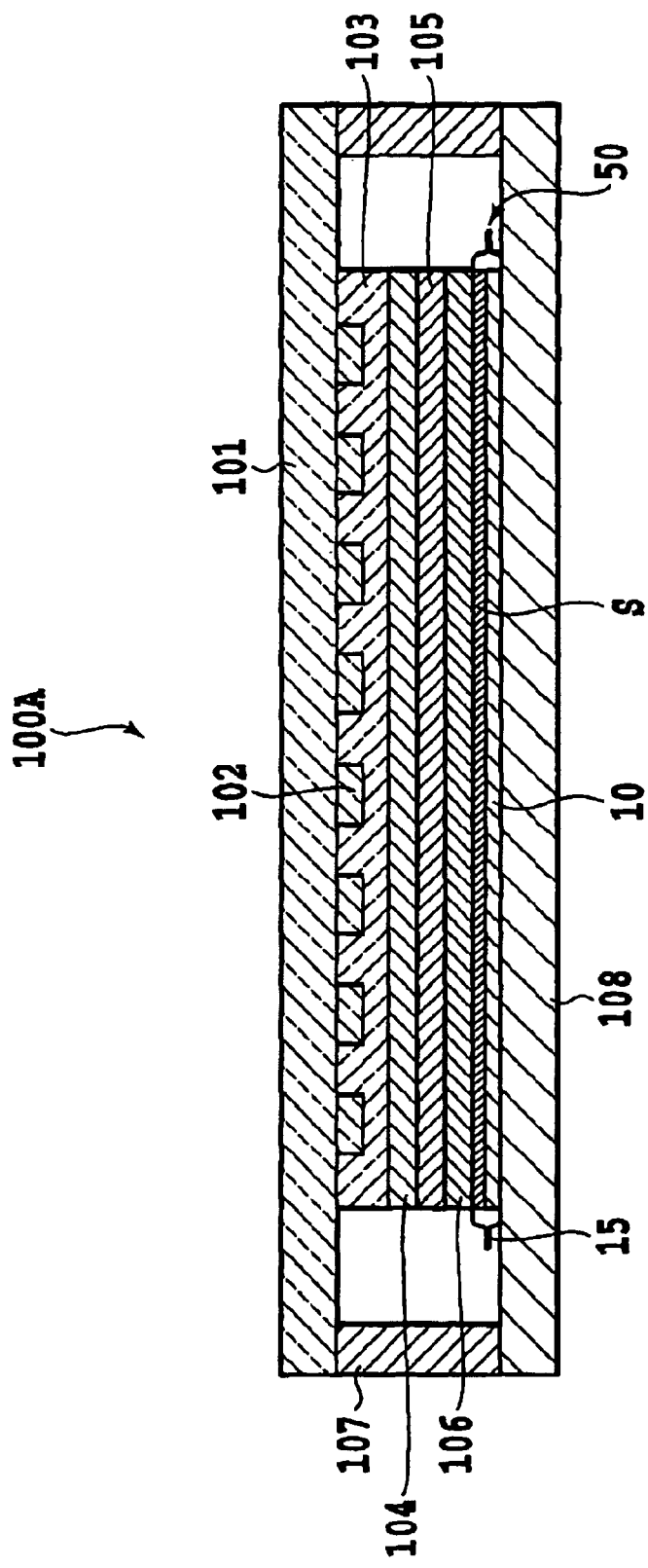
FIG. 17 is a sectional view of an organic electroluminescence display according to a second embodiment of the present invention.

FIG. 17 is a sectional view showing an organic electroluminescence display including a hygroscopic member 50 of the second embodiment. The organic electroluminescence display 100A shown in FIG. 17 is also formed by laminating an ITO anode layer 102, a positive hole transition layer 103, an RGB luminescent layer 104, an electron transition layer 105 and a metallic cathode layer 106, each of which is made of an organic compound, on a transparent glass substrate 101 containing polysilicon TFT. A sealing member 108 is pressed and bonded to the substrate 101 via an adhesive layer 107, and highly-pressurized $N_2$ gas is sealed in the interior of the sealing member 108. In the organic electroluminescence display 10A, the hygroscopic member 50 of this embodiment is disposed between the sealing member 108 and the cathode layer 106, for absorbing and retaining the moisture in the sealed gas. The hygroscopic member 50 is fixed to the inner surface of the sealing member 108 so that the layer of hygroscopic agent S in the air-permeable sheet 15 is opposed to the cathode layer 106.

As described above, the hygroscopic member 50 of this embodiment can be formed to be flexible and thin while maintaining the good hygroscopic capacity. According to the organic electroluminescence display 100A of this embodiment, it is possible to prevent the increase in volume of the display due to the arrangement of the hygroscopic member 50. Thus, the outer surface of the sealing member 108 can be generally flat and a thickness of the display can be reduced as a whole. Also, since the fiber layer 10 to which the hygroscopic agent S adheres is covered with the air-permeable sheet 15 in the hygroscopic member 50, even if the hygroscopic agent S is separated from the fiber layer 10, the separated hygroscopic agent S is left in the air-permeable sheet 15 to maintain the hygroscopic capacity of the hygroscopic member 50 in a favorable state for a long period. By adopting such a flexible and thin hygroscopic member 50 excellent in hygroscopic capacity, it is possible to form the organic electroluminescence display 100A extremely compact (particularly in thickness) while surely preventing the generation of dark spot or others.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. A method for producing a nonwoven fabric by bonding fibers to each other, comprising the steps of:

supplying raw material of said fibers to a first centrifugal separator;

ejecting fibers from said first centrifugal separator by a centrifugal force; and supplying a hygroscopic agent onto said fibers ejected from said first centrifugal separator so that said hygroscopic agent adheres to at least part of said fibers, wherein the hygroscopic agent comprises a calcium oxide and porous particles of silicon dioxide adhering to the periphery of said calcium oxide.

2. A method for producing a nonwoven fabric according to claim 1, wherein a second centrifugal separator is disposed on a lateral side of said first centrifugal separator and wherein a belt mechanism including a belt driven to circulate is disposed below said first and second centrifugal separators, said method further comprising the steps of:

forming, on said belt, a first layer of said fibers ejected from said first centrifugal separator, said hygroscopic agent adhering to at least part of said fibers; and ejecting fibers from said second centrifugal separator by a centrifugal force to form a second layer made only of the fibers on said first layer.

3. A method for producing a nonwoven fabric by bonding fibers to each other, comprising the steps of:

(a) supplying raw material of fibers to a centrifugal separator;

(b) ejecting fibers from said centrifugal separator by a centrifugal force and forming a fiber layer by bonding said ejected fibers to each other; and (c) adhering a hygroscopic agent to said fiber layer, wherein the hygroscopic agent comprises a calcium oxide and porous particles of silicon dioxide adhering to the periphery of said calcium oxide.

4. A method for producing a nonwoven fabric according to claim 3, wherein said step (c) includes the steps of:

heating said fiber layer; and supplying said hygroscopic agent onto said heated fiber layer.

5. A method for producing a nonwoven fabric according to claim 3, further comprising a step of:

(d) covering the entirety of said fiber layer to which said hygroscopic agent adheres with an air-permeable sheet.

6. A method for producing a nonwoven fabric according to claim 5, wherein said step (d) includes the steps of:

supplying said air-permeable sheet above and below said fiber layer to which said hygroscopic agent adheres; and cutting said fiber layer to which said hygroscopic agent adheres to a desired number of pieces having a desired size and simultaneously therewith, covering each of said pieces with said air-permeable sheet.

* * * * *